(12) United States Patent
Giraud et al.

(10) Patent No.: US 12,046,284 B2
(45) Date of Patent: Jul. 23, 2024

(54) ELECTROFORMING PROCESS USING AN INVERSION-INVARIANT LINEAR ECC, AND ASSOCIATED DEVICE

(71) Applicant: COMMISSARIAT A L'ENERGIE ATOMIQUE ET AUX ENERGIES ALTERNATIVES, Paris (FR)

(72) Inventors: Bastien Giraud, Grenoble (FR); Valentin Gherman, Grenoble (FR); Samuel Evain, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/076,304

(22) Filed: Dec. 6, 2022

(65) Prior Publication Data
US 2023/0205625 A1    Jun. 29, 2023

(30) Foreign Application Priority Data
Dec. 23, 2021    (FR) ..................... 2114446

(51) Int. Cl.
*G11C 13/00*    (2006.01)
*G11C 29/42*    (2006.01)
*G11C 29/52*    (2006.01)
*G06F 11/10*    (2006.01)
*G11C 29/04*    (2006.01)

(52) U.S. Cl.
CPC .......... *G11C 13/0069* (2013.01); *G11C 29/42* (2013.01); *G11C 29/52* (2013.01); *G06F 11/1048* (2013.01); *G06F 11/1068* (2013.01); *G11C 13/004* (2013.01); *G11C 2013/0083* (2013.01); *G11C 2029/0411* (2013.01)

(58) Field of Classification Search
CPC ..... G11C 13/0069; G11C 29/42; G11C 29/52; G11C 2013/0083
See application file for complete search history.

(56) References Cited

U.S. PATENT DOCUMENTS 7,032,143 B1 *    4/2006    Waller ................ G11C 7/1051
                                                      365/201
2010/0202194 A1 *    8/2010    Confalonieri ...... G11C 13/0064
                                                      365/163
2019/0377631 A1    12/2019    Hattori

FOREIGN PATENT DOCUMENTS

EP    3 786 801 A1    3/2021

OTHER PUBLICATIONS

Valentin Gherman, Samuel Evain, Bastien Giraud; Binary linear ECCs optimized for bit inversion in memories with asymmetric error probabilities; DATE 2020-2020 Design, Automation & Test in Europe Conference & Exhibition, IEEE, Mar. 2020, Grenoble, France (Year: 2020).*

(Continued)

Primary Examiner — Joseph D Torres
(74) Attorney, Agent, or Firm — BakerHostetler

(57) ABSTRACT

An electroforming process for a resistive memory of a memory device including a memory controller, an encoder computing an inversion-invariant linear error correction code, and a write device connected directly to the encoder. An electroforming device performing electroforming through write operations to such a resistive memory and to a method for checking a write operation.

12 Claims, 3 Drawing Sheets

(56) References Cited

OTHER PUBLICATIONS

Hirtzlin, et al., "Hybrid Analog-Digital Learning with Differential RRAM synapses", 2019 IEEE International Electron Devices Meeting (IEDM), 2019.

Gherman, et al., "Binary Linear ECCs Optimized for Bit Inversion in Memories with Asymmetric Error Probabilities", 2020 Design, Automation & Test in Europe Conference & Exhibition (DATE), pp. 298-301, 2020.

* cited by examiner $$H = \begin{bmatrix} 0 & 1 & 1 & 1 & 0 & 0 \\ 1 & 0 & 1 & 0 & 1 & 0 \\ 1 & 1 & 1 & 0 & 0 & 1 \end{bmatrix}$$
$$\underbrace{\phantom{xxxxxx}}_{P} \underbrace{\phantom{xxxx}}_{I_3}$$

ELECTROFORMING PROCESS USING AN INVERSION-INVARIANT LINEAR ECC, AND ASSOCIATED DEVICE

CROSS-REFERENCE TO RELATED APPLICATION

This application claims priority to foreign French patent application No. FR 2114446, filed on Dec. 23, 2021, the disclosure of which is incorporated by reference in its entirety.

FIELD OF THE INVENTION

The present invention relates to an electroforming process for a resistive memory. The invention relates in particular to an electroforming process for a resistive memory coupled to a memory controller.

BACKGROUND

Resistive memories are non-volatile memories having a high density, low electrical energy consumption and able to have a long lifetime depending on use conditions.

There are many resistive memory technologies. Mention may be made notably of conductor bridge-based resistive memories, also called CBRAM (for "Conductive-Bridging Random-Access Memory"), or oxide-based resistive memories, also called OxRAM (for "Oxide-based Random-Access Memory"), or else phase-change memories, also called PCM.

A resistive memory (also called RRAM memory) consists of a multitude of resistive memory cells arranged in rows and columns so as to form a matrix. An RRAM memory cell is equipped with at least one resistive element the conductance of which is able to be modified.

Typically, an RRAM memory cell consists of a metal-insulator-metal stack and has, in its initial state, a high-resistance state (HRS). Before they are used, some types of resistive memory, such as OxRAM or CBRAM memories, require electrical activation or, in other words, "electroforming". Applying a high-voltage pulse through the RRAM cell makes it possible to form conductive paths in the switching layer (insulating portion) and leads to the RRAM cell being "switched" into a low-resistance state (LRS), corresponding to a partial breakage of the insulating structure, or in other words to the formation of a conductive "filament" through the oxide.

The general process of this "breakage" of the insulating layer of the cell is generally called "electroforming" (or "forming") and is carried out prior to use of the RRAM memory. Following this "electroforming" process, applying an appropriate voltage (significantly lower than the high-voltage pulse) for a predefined duration makes it possible, as the case may be, either to reduce the "length" of the conductive filament, leading to an HRS resistance state, or to lengthen the conductive path, leading to an LRS resistance state. These operations are known to a person skilled in the art by the term "SET" or "RESET". The dielectric material arranged between two conductive electrodes of the cell is then capable of changing reversibly between the two HRS and LRS resistance states, these states making it possible to store an information bit in the memory cell.

An elementary resistive memory cell generally consists of one transistor (1T) and of one resistive component or resistor (1R), wherein an information bit is encoded through the value of the electrical resistance of the resistor. For these elementary cells known as 1T1R, a logic '0' may for example be encoded by programming the resistor in a high-resistance state HRS, and a logic '1' may be encoded by programming the resistor in a low-resistance state LRS, and reference is then made to encoding in 1T1R mode.

However, the difference between the lowest resistance value, corresponding to an LRS level, and the highest resistance value, corresponding to the HRS level, also called "memory window", is often small. Therefore, "differential encoding" is commonly used to code a binary value to be stored. An information bit may be encoded in what is called a 2T2R memory cell, consisting of two elementary 1T1R cells, comprising 2 transistors (2T) and 2 resistors (2R), and reference is then made to encoding in 2T2R mode.

Since each of the LRS and HRS states may be associated with a logic value, that is to say 1 or 0, it may be considered that, in a 2T2R cell, one of the two resistive elements encodes the bit to be programmed in the non-inverted version, while the other resistive element encodes the same bit in the inverted version. For example, a logic '1' is encoded by programming the resistor of the first 1T1R cell in a high-resistance state HRS and the resistor of the second 1T1R cell in a low-resistance state LRS, and a logic '0' is encoded by programming the resistor of the first 1T1R cell in a low-resistance state LRS and the resistor of the second cell in a high-resistance state HRS.

Thus, in differential encoding mode, each information bit is encoded in a 2T2R elementary cell formed of two resistive elements that are written to in state opposition, that is to say one of the resistive elements written to with an HRS level and the other with an LRS level. The respective resistance levels of the two resistive elements are always determined in the same order between the two elements, and define whether a logic '1' or '0' is present depending on whether it corresponds to the states HRS-LRS or LRS-HRS.

During an operation of writing to a 1T1R or 2T2R memory cell, it is necessary to ensure that each electrical resistance that is to be programmed to an HRS or LRS state is respectively either greater or less than a reference value $R_{REF}$. An electrical resistance is compared with the value $R_{REF}$ through a read operation in which the programmed resistance is compared with the value $R_{REF}$ using a detection amplifier or SA (for "Sense Amplifier"). This read operation with comparison with a reference value is hereinafter called 1T1R mode.

All of the read operations performed in 1T1R memories are performed in 1T1R mode. To read the stored datum from an RRAM cell, a small readout voltage that does not interfere with the current state of the cell is preferably applied in order to determine the logic state of the cell.

In memories in which information is encoded in 2T2R mode, read operations are generally performed in 2T2R mode, also called reading in differential mode. The values of the two resistors present in a 2T2R memory cell may be compared with one another using a differential detection amplifier SA, consisting in comparing the two resistance values of the resistors forming the memory cell. It will also be noted that the readout device may also be intended to read each resistor of a cell individually by comparing the resistance of each resistor with a reference value. The presence of such a "single" readout device is commonly used in electroforming operations in order to be able to check the resistance level of each resistor individually.

One technique for reading a datum stored in a 2T2R memory cell is described in the document: "Hybrid Analog-Digital Learning with Differential RRAM synapses" by Bocquet et al. IEDM19-534. It uses a readout circuit equipped with a locking detection amplifier that, during a read operation, is coupled to the differential pair of resistive elements by way of a pair of bit lines and is equipped with nodes the potentials of which toggle as a function of values of a current passing through the resistive elements. This type of detection amplifier is implemented with few transistors and operates as a high-gain differential current amplifier. It makes it possible to directly compare currents that pass through the resistive elements and flow via bit lines.

It will be noted that memories comprising 2T2R cells are generally provided with a device for writing to the resistors of each cell that in practice performs two 1T1R write operations to write to each of the resistors in the state that should be its own (reminder: two different states for the resistors of a 2T2R differential cell).

Given that the resistive elements keep their respective values even after the applied voltage has been removed, the RRAM resistive memory falls within non-volatile memories. However, some uses of a memory involve frequent transitions between the HRS and LRS states that may introduce damage, the programmed resistance values possibly changing due to relaxation phenomena and then leading to worsening of the performance of the RRAM.

The retention time of information in a resistive memory then depends on (a) read operations, (b) use temperatures and/or (c) high magnetic fields in the case of magnetic memories.

Switching voltage variations and cell-to-cell non-uniformity lead to the resistors that are programmed in the LRS state possibly drifting to an HRS state or vice versa. Therefore, this sliding of the programmed resistance values may cause errors during read operations and diminish the performance of the memories.

To reduce the error rate of RRAM memories, one commonly used solution is to use an error correction code or ECC, which encodes the data before they are written to memory. Generally, the ECC encoder is located inside or close to the memory controller. A memory controller according to the present invention is an electronic circuit the function of which is that of translating requests, generally from a host electronic system, to perform electroforming, read or write operations on resistive memories.

When data are encoded with an ECC code, check bits are added to the data bits, the check bits representing redundant information computed based on data bits that makes it possible to detect and correct errors affecting both the data bits and the check bits. The set of data bits and check bits forms a codeword.

These check bits are generated transparently for the user of the memory. During an operation of writing to memory, the ECC encoder inside the memory prepares the codeword and all of the bits of the codeword are written to 2T2R memory cells, by performing, for each memory cell, a SET operation for one of the resistors and a RESET operation for the other of the resistors (each operation generally being performed in 1T1R write mode). During the electroforming step prior to use of the memory, the equivalent of a SET operation is performed for each resistor by writing a "1" to each resistor. This write operation during the electroforming step differs essentially from another write operation (after electroforming) through the voltage-current conditions that are applied, but, in the memory controller, it is indeed writing of a "1" that is requested for each resistor during electroforming.

In known RRAM memories using an ECC encoder, the bits of the memory encoding the ECCs are generally positioned in particular locations, generally grouped together.

The write device for writing to the cells dedicated to the ECC bits generally comprises a particular write mode for the electroforming step in order to be able to "impose" the value "1" to be written during the special write operation formed by the electroforming step (with the specific current/voltage conditions). This write device with its write mode dedicated to ECC bits is in practice more complex than the write device for the rest of the memory matrix, since it has to be able to be controlled so as to take, at input, either the ECC values computed by the encoder during a conventional write operation (outside of electroforming), or imposed values (values at "1") imposed during a special electroforming write operation for each of the resistors of the memory cells.

There is thus a need to be able to simplify the write device for writing the ECC bits so as to avoid this complexity in terms of managing the values to be taken at input, which is reflected by a larger memory surface area and by more complicated control of the memory in order to carry out all of the electroforming operations for all of the cells of the memory.

Moreover, it is also desirable to be able to ensure that there is no faulty resistor that always leads to reading of a logic value of "1" or "0" during check read operations. There is thus a need for a test after an electroforming operation that makes it possible to check that the electroforming has been carried out correctly, specifically without making the memory device more complex.

SUMMARY OF THE INVENTION

The invention aims to overcome all or some of the problems cited above by proposing an electroforming process using an inversion-invariant linear ECC. The invention thus aims to dispense with additional steps for electroforming memory cells or with making a write system more complex.

To this end, one subject of the invention is an electroforming process for a resistive memory of a memory device including a memory controller, an encoder computing an inversion-invariant linear error correction code, and a write device connected to the encoder, the process comprising the steps as cited in the independent claim.

Advantageously, the process comprises subsequent steps that are cited in the dependent claims.

Another subject of the invention relates to an electroforming device comprising means for implementing the steps of the electroforming process.

Advantageously, the means comprise a host processor and the steps of the electroforming process are implemented by interactions between the host processor and the memory controller.

Advantageously, the inversion-invariant linear error correction code is of the type SEC, SEC-DED, DEC, DEC-TED, TEC, TEC-QED, etc.

The invention also relates to a method for checking a write operation to a resistive memory of a memory device including a memory controller and an encoder computing an inversion-invariant linear error correction code, the method comprising the following steps:

requesting reading of a codeword written to an initial address and checking whether all of the bits of this codeword all have one and the same logic value from among two possible logic values "0" and "1":

if all of the bits of this codeword all have the same logic value "0" or "1", reading a status register of the memory controller in order to check the presence or absence of a correctable or non-correctable error in the word that has just been read; and, depending on the result of the check:
signalling a write error; or
ending the method.
if all of the bits of this codeword do not all have the same logic value "0" or "1", signalling a write error.

Advantageously, the steps of the method for checking a write operation are implemented in order to check writing of a codeword in an electroforming operation.

Advantageously, the steps of the method for checking a write operation are implemented in order to check writing of a codeword after steps of:
requesting a write operation to the memory device at an initial address corresponding to the selection of multiple resistors, with data to be written comprising k data bits all having one and the same first logic value from among two possible logic values "0" and "1";
encoding the k data bits with the inversion-invariant linear error correction code so as to obtain a codeword comprising the data bits and r check bits, such that the check bits are dependent on an odd number of the data bits, resulting in the data bits and the check bits all having the same first logic value; and
writing the codeword to the selected resistors of said resistive memory, the memory controller writing the codeword to the selected resistors in 1T1R or 2T2R mode.

The invention also relates to a device for checking a write operation to a resistive memory of a memory device including a memory controller, an encoder computing an inversion-invariant linear error correction code and an associated decoder, the memory device being connected to an external processor, the checking device comprising means for implementing the steps of the method for checking a write operation.

BRIEF DESCRIPTION OF THE DRAWINGS

Other features, details and advantages of the invention will become apparent upon reading the description given with reference to the appended drawings, which are given by way of example and in which.

DETAILED DESCRIPTION

Faced with the abovementioned problem of simplifying electroforming operations for memory cells coding ECC bits, various approaches may be contemplated.

It may be contemplated not to have a specific write device for the ECC bits and to have a write device that takes only the codewords supplied by the encoder at input, without having a specific "bypass" mode for bypassing the values to be written to the ECC bits in electroforming mode. It is thus possible to search for a datum to be written that, once passed through the encoder, leads to a codeword whose ECC bits all have the value "1", making it possible to carry out electroforming of these ECC bits. However, such a datum might not exist depending on the chosen encoder type. Furthermore, it is unlikely that the identified input datum is itself only a string of "1" values allowing the electroforming operation to be carried out at the same time as non-ECC cells. It would thus very likely be necessary to double the number of programming operations for the memory cell in order to carry out a first write operation targeting the electroforming of non-ECC cells (with writing of a value "1" for these cells) and a second electroforming write operation targeting ECC cells. One drawback of this process is that the memory cells would experience the high-voltage pulses required for electroforming twice, which could weaken them.

Another possible approach is that of choosing an encoder that makes it possible to have ECC bits all at "1" for an input datum that corresponds to a sequence of "1" values. This approach is possible if using an encoder that implements a particular correction code, as will become apparent below.

A "binary linear correction code" is understood to mean a set of codewords that are generated by adding a defined number (r) of check bits to a plurality k of data bits, the check bits being generated from data bits while complying with the following equation:

[Math. 1]

$$H \cdot v = 0 \quad \text{Equation (1)}$$

Where v is a column vector corresponds to a codeword (k data bits and r check bits) and H corresponds to a parity matrix, the parity matrix comprising only binary values ('0' or '1'), each column of the matrix being different from the other columns, and each column of the matrix comprising at least one value other than 0.

Figures 4, 5:
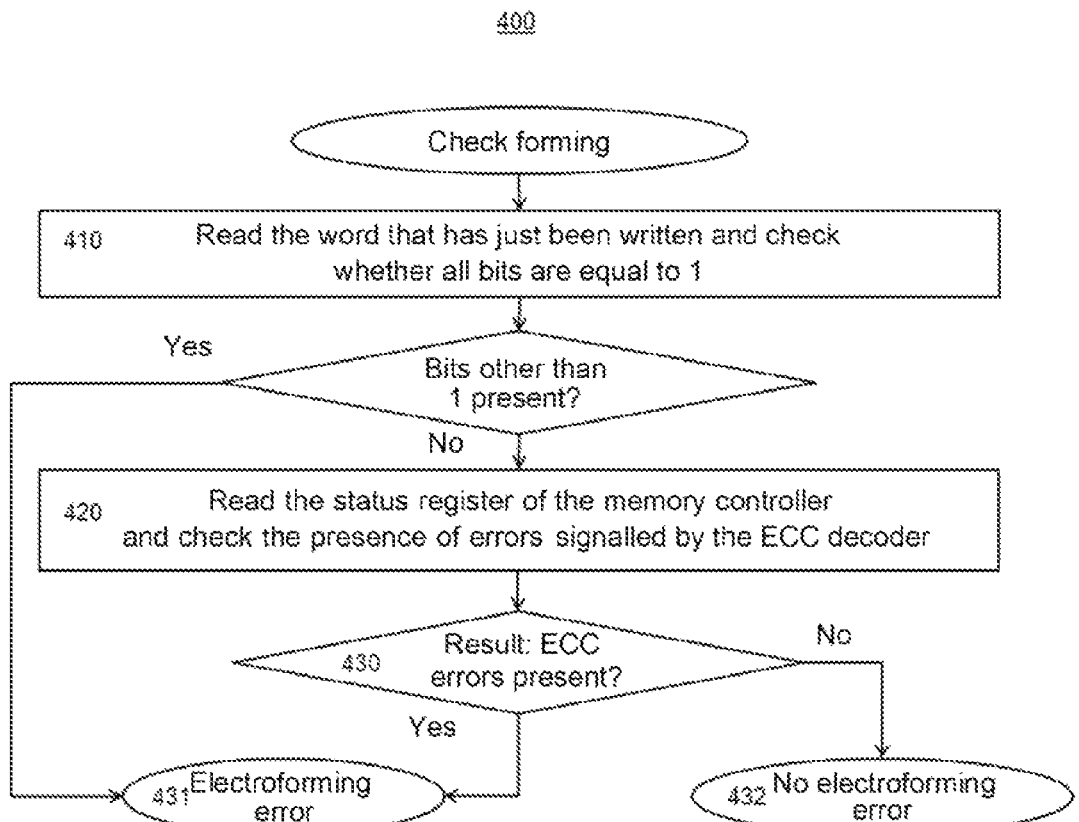
FIG. 4 shows a method for checking an electroforming operation, in particular electroforming carried out using the process from FIG. 2 or 3.
FIG. 5 is an illustration of a parity matrix H for an error correction code with 3 data bits.

The systematic linear correction codes are defined using a parity matrix $H=[P, I_r]$ consisting of a sub-matrix P in which each column corresponds to data bits, and of an identity sub-matrix $I_r$ in which each column corresponds to check bits. FIG. 5 illustrates a parity matrix H for a binary linear correction code with 3 data bits (k=3) and 3 check bits (r=3). The first 3 columns correspond to the sub-matrix P and the last 3 columns correspond to the sub-matrix $I_r$ for r equal to 3.

The example presented in FIG. 5 corresponds to a systematic correction code, i.e. each codeword v is divided into a vector of data bits d and a vector of check bits c and may be denoted:

[Math. 2]

$$v = \begin{pmatrix} d1 \\ d2 \\ d3 \\ c1 \\ c2 \\ c3 \end{pmatrix} \quad \text{Equation (2)}$$

This codeword should satisfy equation (1) and the check bits are for example computed as follows: c1=d2+d3 c2=d1+d3; c3=d1+d2+d3, each check bit corresponding to a value congruent with the modulo 2 sum (therefore each check bit having a binary value, '0' or '1'). In the example of the matrix of FIG. 5, the check bits c1 and c2 are even (as they are linked to two data bit values), and the bit c3 is an odd check bit (as it is linked to three data bit values).

Thus, according to this example, if all of the data bits are inverted, c1 and c2 will keep their values, while the value of c3 will be inverted. This is due in particular to the fact that c3 is dependent on an odd number of data bits.

A binary linear ECC is said to be "inversion-invariant" when the inversion of all of the data bits of a codeword requires the inversion of all of the check bits in order to obtain a new codeword. Thus and in line with what has been recalled above, a binary linear ECC is inversion-invariant when all of the check bits are dependent on an odd number of data bits. This means that, with an inversion-invariant linear ECC, all of the check bits become 0 or 1 if all of the data bits are respectively equal to 0, 1. Therefore, an inversion-invariant linear ECC contains one codeword in which all of the bits are equal to 0 and another codeword in which all of the bits are equal to 1.

Figure 1:
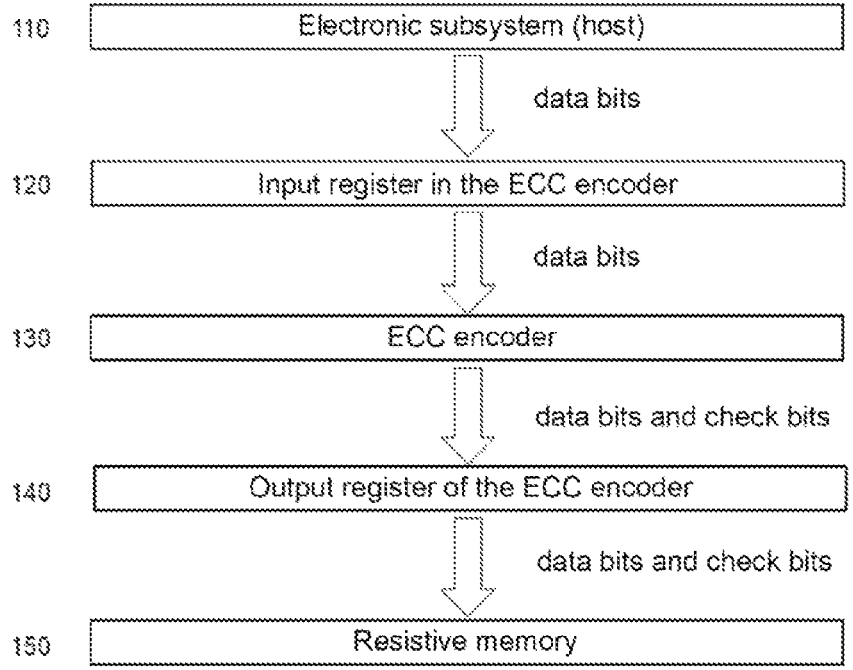
FIG. 1 shows a general system that uses a resistive memory and makes it possible to implement the steps of an electroforming process for a resistive memory according to one embodiment of the invention.

FIG. 1 shows a general system 100 that uses a resistive memory and makes it possible to implement the steps of an electroforming process for a resistive memory according to one embodiment of the invention. The system comprises an electronic subsystem 110, also called host electronic subsystem, a memory controller 112 comprising an error correction code encoder 130 (called ECC encoder) having an input register 120 and an output register 140, and a resistive memory 150. The host electronic subsystem may comprise one or more processor cores, a microcontroller and a programmable logic circuit, also called FPGA (acronym for "Field-Programmable Gate Array"). In addition or as an alternative, the host subsystem may correspond to an ASIC (acronym for "Application-Specific Integrated Circuit") integrated circuit.

During an electroforming operation, like for a write and read operation, for a resistive memory such as the one contained in the general system 100, data bits are issued by the electronic subsystem 110 and sent to the memory controller by way of the input register in the ECC encoder. A memory controller drives the programming operation required for the electroforming operation, along with the future operations of writing to and reading the resistive memory. The programming operations are performed using the data bits of a word issued by the electronic subsystem 110. The memory controller 112 comprises an encoder and an ECC decoder, the encoder being used during a write (or programming) operation and the decoder being used during a read phase. The data bits of a word issued by the electronic subsystem 110 are first used by the ECC encoder, which generates check bits that are added to the string of data bits so as to form a codeword. All of the bits of the codeword will be programmed/written to the same address during an electroforming or write procedure. These check bits may notably be used by an ECC decoder to correct any errors in storing a word in the resistive memory during a read operation.

Figure 2:
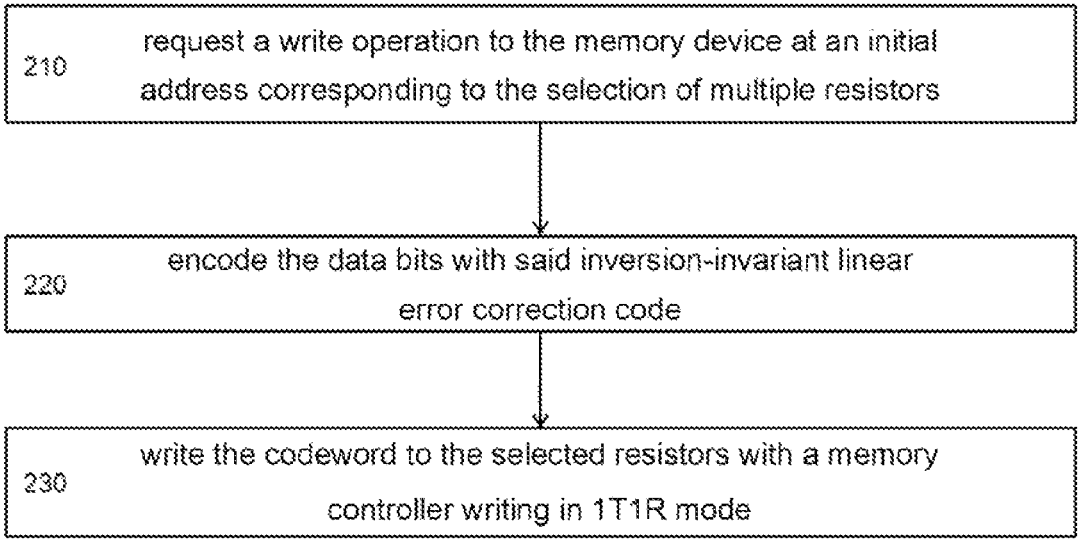
FIG. 2 shows an electroforming process for a resistive memory of a memory device including a memory controller and an encoder computing an inversion-invariant linear error correction code.

FIG. 2 shows an electroforming process 200 for a resistive memory of a memory device such as for example the one from FIG. 1 including a memory controller and an encoder computing a correction code. The process comprises a step 210 of requesting writing of data to the memory device at an initial address that corresponds to the selection of multiple memory cells, i.e. to write to the corresponding resistors. These data to be written comprise k data bits that all have one and the same first logic value, called electroforming value, selected from among the two logic values "0" and "1".

The process according to FIG. 2 continues with a step 220 of encoding the data bits with an inversion-invariant linear error correction code, resulting in a codeword comprising the k data bits and r check bits. The check bits are dependent on an odd number of data bits, which means that the data bits and the check bits all have the same first logic value (always selected from among the two logic values "0" and "1").

The process according to FIG. 2 continues with a step 230 of writing the codeword obtained in the previous step to the selected resistors of the resistive memory. The memory controller carries out this operation in 1T1R mode by writing individually to each resistor, putting them into HRS or LRS states according to the respective logic value of each bit of the codeword and according to write conditions allowing electroforming, that is to say notably at a high voltage.

Figure 3:
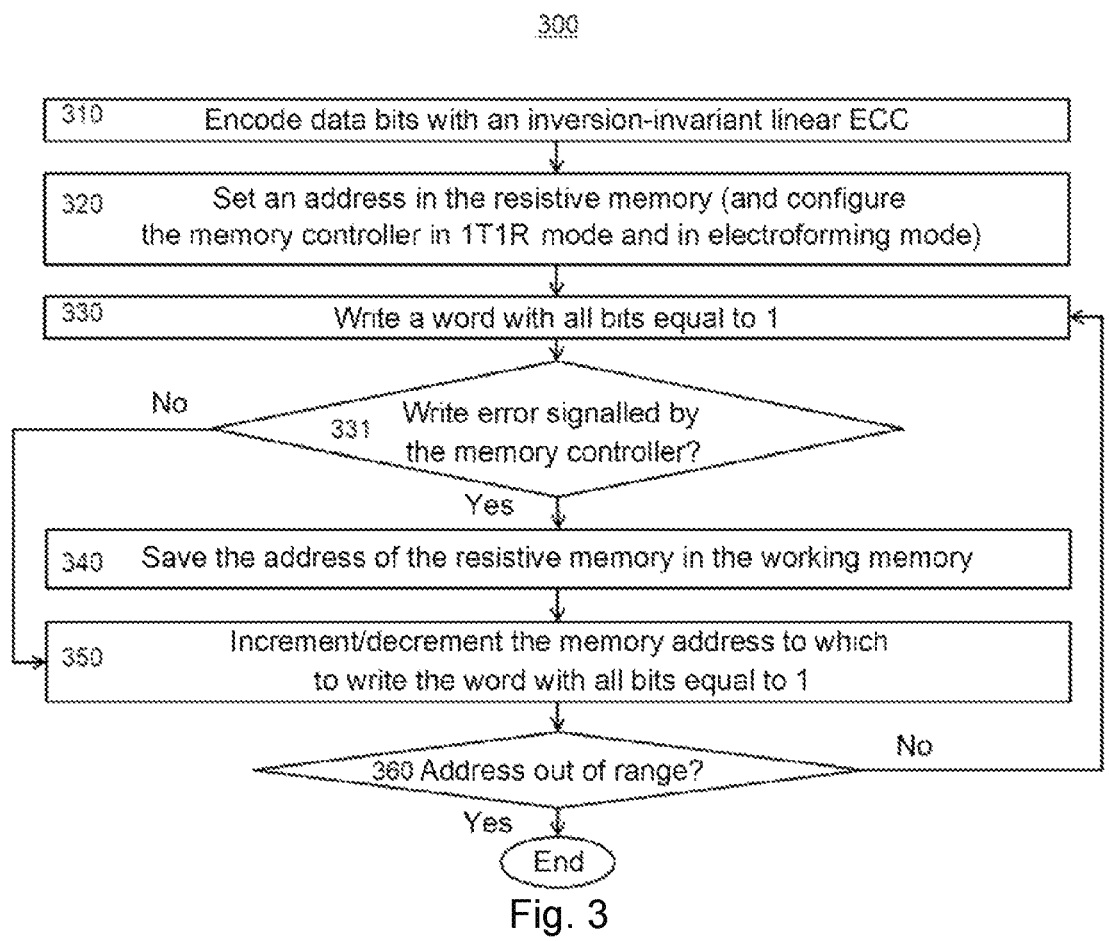
FIG. 3 details steps of the electroforming process from FIG. 2.

FIG. 3 details steps of the electroforming process described above for a resistive memory coupled to a memory controller and having data protected by an inversion-invariant linear error correction code. The electroforming process 300 comprises a step 310 of encoding data bits equal to 1 with an inversion-invariant linear error correction code (ECC).

Following the encoding of these data bits and the obtaining of a codeword, the process comprises a step 320 of setting the electroforming address in the resistive memory to a first value corresponding for example to the smallest address value from among the address values allowing a memory cell to be selected. Furthermore, in step 320, the memory controller is configured, in 1T1R write mode and in electroforming mode, for this "special electroforming" write operation. It is indicated notably that the configuration of the memory controller is in 1T1R mode as the electroforming process is also necessary for differential resistive memories, which have to be programmed in 1T1R mode during electroforming operations.

Step 320 of setting an address in the resistive memory and of configuring the memory controller in 1T1R mode and step 310 of encoding data bits with an inversion-invariant linear ECC are steps that may be swapped in time or carried out in parallel depending on the hardware layout of the circuit, and notably the control means used by the host to control the memory controller, and possibly the encoder.

The electroforming process continues with a step 330 of writing to the resistive memory in accordance with said codeword at said electroforming address. Having configured the memory controller in electroforming mode guarantees that the write operation will be performed by applying high-voltage pulses required for the electroforming of cells of a resistive memory.

In the electroforming process of the present invention, this step 330 of writing, to the resistive memory, data bits equal to 1 that are encoded with an inversion-invariant linear ECC guarantees that the codeword written to the memory will have all of its bits equal to 1. Writing a codeword with all bits equal to 1 in 1T1R mode will be reflected by programming all of the resistors of the memory cells at the indicated address to LRS. The electroforming mode for the memory controller guarantees the execution of an electroforming operation on the memory cells at the indicated address.

The electroforming process for a resistive memory according to FIG. 3 continues with a step 331 of checking, at the electroforming address in the resistive memory, that said codeword has actually been programmed and, therefore, that the memory cells have actually been electroformed. This step may be executed by the host processor via a read operation at the electroforming address. An electroforming error may be identified by the host by identifying bits that are not equal to 1. The host should also check whether the memory controller has signalled any errors, notably errors detected by the decoder during the post-forming read step. This potential read error check may be performed either by signalling of a read error sent by the memory controller to the host, or through an action performed by the host of checking status registers of the memory controller. In the second case, it is assumed that the address of any correctable or non-correctable error identified by the ECC decoder will be saved in a status register of the memory controller, and/or in a register of an external processor connected to the memory device. If a write error has been identified, the electroforming process continues with a step 340 of saving said electroforming address "with error" in a dedicated memory, called working memory, associated with the host (and not shown). It will thereby be possible, in the remainder of the procedure, to re-attempt the electroforming of the cells of the resistive memory located at the addresses saved in the working memory of the host.

Whether in the case of an identified write error or in the case in which no write error has been identified, the electroforming process continues with a step 350 of incrementing or decrementing the electroforming address in order to generate a new electroforming address. The process may thus be continued by reiterating step 330 of writing said codeword, in which all of the bits have the value '1', to said incremented or decremented electroforming address, so as to form the entire resistive memory.

The electroforming process for the resistive memory according to FIG. 3 continues with a step 360 of checking that the incremented or decremented electroforming address is contained within the range of the resistive memory. "Contained within the range of the resistive memory" is understood to mean that the electroforming process is contemplated for a portion of or the entire resistive memory and that the electroforming addresses cannot exceed the perimeter of these portions of or the entire resistive memory.

If the result of the check is that the new incremented or decremented electroforming address is not contained within the range of the resistive memory, then the electroforming process may end. If the result of the check is that the incremented or decremented electroforming address is contained within the range of the resistive memory, then the process continues with the reiteration of step 330 of forming the resistive memory using said codeword at said incremented or decremented electroforming address.

In one embodiment, the electroforming process comprises the subsequent step of supplying the read codeword to a decoder able to supply k data bits that are corrected if necessary based on the check bits, the decoder being able to inform a status register of the memory controller indicating the presence or absence of a correctable or non-correctable error in the word that has just been read, and in which the step of comparing the read value and the expected value includes an operation of consulting said status register of the controller.

FIG. 4 shows steps of a method 400 for checking an electroforming operation, in particular electroforming carried out using the process described above with reference to FIGS. 2 and 3. These steps may be carried out independently of or in addition to the steps of the described electroforming process.

Moreover, these steps may be carried out in the same way as a method for checking a write operation to a resistive memory of a memory device including a memory controller and an encoder computing an inversion-invariant linear error correction code and an associated decoder.

The method 400 comprises a first check read step 410 of requesting, via an external processor, a read operation at the initial address and/or at the new address and checking whether all of the data bits returned to said processor, obtained at output from a decoder that received the read codeword, all have one and the same logic value from among two possible logic values "0" and "1".

If it is read and checked that some data bits have a value other than the expected logic value '0' or '1' (branch Yes in 412), then the method continues with a step 431 of signalling an electroforming error.

If it is read and checked that no bit of this codeword has a logic value other than '1' or '0' of the expected value (branch No in 412), then the method continues with a step 420 of reading a status register of the memory controller in order to check 430 the presence or absence of an error that has been corrected by said decoder in the word that has just been read (checking whether the ECC decoder has raised a flag indicating the presence of a correctable or non-correctable error in the word that has just been read).

If (branch No in 430) the result is that no (correctable or non-correctable) error has been indicated by the status register of the memory controller, the method ends with a step 432 of concluding that there are no electroforming errors.

If (branch Yes in 430) the result is that there is a correctable or non-correctable error indicated by the status register of the memory controller, the method continues with step 431 of taking into account the electroforming error, i.e. in practice in keeping the current address at which an electroforming operation has just been performed and checked. Subsequently, the host may relaunch a potential electroforming operation at this address, or may potentially decide not to use the memory cells located at this address that led to errors.

Generally speaking, the steps described in the flowcharts of FIGS. 2 to 4 are a "high-level" description of the programming and checking operations that it is desired to carry out in a resistive memory. However, these operations are implemented in practice by interactions between the host 110 and the memory controller 112. It will be noted that the encoder and the ECC decoder are generally contained within the "boundaries" of the memory device, which also includes, beyond the matrix of memory cells, row/column control devices, write and read devices along with the memory controller. The "boundaries" of the memory device are defined by the input/output (or I/O) blocks. The host requesting the execution of an electroforming process may be a processor connected to the memory device by a "system" bus comprising a data bus, an address bus and control signals connected to the input/output blocks of the memory.

According to one mode of implementation of the electroforming process, the host processor directly sends successive write and read commands in order to carry out the operations described in relation to FIGS. 2 to 4. Thus, to carry out the equivalent of steps 310 to 330, the host processor sends a write instruction to the memory device, with a control signal for the bus of the memory device, telling it that "electroforming" mode is active, by setting the value "1" on the data bus, and by setting the initial address on the address bus. Upon receipt of this write command, the memory device, via its memory controller, will launch the execution of the computation of the ECC by the encoder and will then command the actual writing of the codeword (with values at 1) by activating the row/column control devices based on the received address, and by activating the write devices, which receive the codeword from the encoder as write instruction.

To carry out the equivalent of step 331, or 410, the host processor sends a read instruction to the memory device with a control signal for the bus of the memory device, telling it that read mode is active, by setting the initial address on the address bus and while awaiting the read datum that will be received on the data bus. Upon receipt of this read command, the memory device, via its memory controller, will launch the execution of the actual reading of the codeword by activating the row/column control devices based on the received address, and then transmit the read codeword to the decoder. The decoder identifies whether there are any errors in the data portion of the codeword using the ECC bits. If there is an error (or multiple errors), the decoder signals this to the memory controller, for example by writing to an internal register of the memory controller. Furthermore, if there is an error, the decoder corrects the data if possible. If it was possible to correct the datum or if there were no errors, the decoder supplies the data on the data bus via the input/output block. The host processor retrieves the data present on the bus and checks whether these data are all equal to the value "1", which should correspond to the value expected after an electroforming step.

The processor also checks that no error corrections have been carried out by the decoder (via for example consulting the internal register of the memory controller, which may be made accessible to the host processor) before validating the correct performance of the electroforming at the current address.

In all of the exemplary embodiments described above, it has been taken as read that the electroforming step consists in carrying out a SET operation leading to the selected resistive memory being written to in a low-impedance state LRS.

It has also been considered that the values of the data leaving the encoder are transmitted to the write device and written to the selected memory without any operation of inverting the value in this chain. A person skilled in the art would thus understand that it is accordingly necessary to adapt the data value indicated by the processor upon a write request if for example an inverter were to be placed at the output of the encoder block, between the latter and the write device. A person skilled in the art may thus of course contemplate adaptations to the process and to the device described above so as to keep the advantage of the present invention, specifically of not needing a specific ECC bit write device (which would then involve having a bypass of the encoder for the ECC bits in electroforming mode).

In the present invention, the write device for the data bits and ECC bits is connected directly to the encoder and directly receives, as write value instruction, the values from the encoder, without there being any need to differentiate this operating mode depending on whether the electroforming mode or "standard" write mode is active. This advantage in terms of simplicity of the memory device is obtained by virtue of an encoder implementing an inversion-invariant linear error correction code as has been explained above.

In the examples described above, electroforming is normally carried out with a single write operation, in electroforming mode, so as to change each memory cell to the LRS state. This is notably the case for CBRAM and OxRAM resistive memories. For other types of resistive memory, it is possible for there to be a need to perform multiple write operations to carry out the electroforming operation correctly. In the case for example of PCM memories, before standard use thereof, it is necessary to perform multiple SET and RESET cycles under particular write conditions (in terms of voltage/current). Thus, in this case, the electroforming flowcharts described above have to be adapted so as to carry out not one write operation but a series of write operations so as to successively write "1" (perform a SET operation) and then "0" (perform a RESET operation), and restart multiple times. At the end of this repetition of SET/RESET write operations, it may still be checked that the write state at "0" and/or at "1" is correct. In this case too, the benefit of using an encoder implementing an inversion-invariant linear error correction code makes it possible "naturally", without any additional hardware or software, to electroform the ECC bits at the same time as electroforming the data bits, thereby ultimately allowing greater speed and making it possible to avoid needless "stress" on the memory cells (which stress would be linked to voltage/current conditions that are detrimental to the cells if they are repeated multiple/too many times).

In the examples described above, the single electroforming step that is carried out aims to change each resistor from an initial technological state (called "pristine"), which exhibits a "very HRS" high impedance, to a low-impedance state LRS. Furthermore, we have adopted the convention that the SET operation is carried out by requesting writing of a value "1" to the memory. If an inverse convention were to be adopted, specifically that of writing a value of "0" to carry out an operation of putting into the LRS state (change from HRS to LRS) and a value of "1" to carry out the inverse operation of putting into the HRS state, then it is possible to use an encoder implementing a "simple" linear correction code, without it being necessary for the linear correction code also to be inversion-invariant.

It will nevertheless be noted that, beyond carrying out the electroforming step by way of a memory device not requiring the presence of an encoder that is able to be bypassed (so that the memory controller is able to control directly), it is beneficial to be able to carry out write operations to check the memory matrix, consisting in writing a "1" to all of the cells, and then a "0" to all of the cells, including to the ECC cells, not only to the data cells. These check write operations make it possible notably to ensure that there is no faulty resistor that always leads to reading of a "1" or of a "0". To be able to carry out these checks, without extra hardware embedded in the memory device, and from the host processor, it is necessary to use an encoder that implements an inversion-invariant linear error correction code. Using such an encoder thus makes it possible in practice to simplify the memory device, in order to carry out electroforming steps and/or in order to carry out test steps "all at 1" and "all at 0".

The various embodiments presented in this description are not limiting and may be combined with one another. Furthermore, the present invention is not limited to the embodiments described above, but extends to any embodiment that falls within the scope of the claims.

Without limitation, one known ECC is the SEC-DED (acronym for "Single Error Correction Double Error Detection") code, which makes it possible to correct errors on just one bit (SEC) and to detect errors on two bits (DED). A person skilled in the art may refer to various documents available in the literature and describing types of error correction code and error correction and detection mechanisms based on an ECC in a resistive memory.

The invention claimed is:

1. A method for checking a write operation to a resistive memory of a memory device including a memory controller and an encoder computing an inversion-invariant linear error correction code, the method comprising the following steps:

requesting reading of a codeword written to an initial address, the codeword having been written by a write device connected directly to the encoder and having directly received, as write value instruction, values from the encoder, and checking whether all bits of this codeword all have one and a same logic value from among two possible logic values "0" or "1"; and if all of the bits of this codeword all have the same logic value "0" or "1", reading a status register of the memory controller in order to check a presence or absence of a correctable or non-correctable error in the codeword that has just been read; and depending on a result of the check:

signaling a write error;

or ending the method;

if all of the bits of this codeword do not all have the same logic value "0" or "1", signaling a write error.

2. The method according to claim 1, wherein the steps are implemented in order to check writing of a codeword in an electroforming operation.

3. The method according to claim 1, wherein the steps are implemented in order to check writing of a codeword after steps of:

requesting a write operation to the memory device at an initial address corresponding to a selection of multiple resistors, with data to be written comprising k data bits all having one and a same first logic value from among two possible logic values "0" or "1";

encoding the k data bits with the inversion-invariant linear error correction code so as to obtain a codeword comprising the data bits and r check bits, such that the check bits are dependent on an odd number of the data bits, resulting in the data bits and the check bits all having the same first logic value; and writing the codeword to the selected resistors of said resistive memory, the memory controller writing the codeword to the selected resistors in 1T1R or 2T2R mode.

4. A device for checking a write operation to a resistive memory of a memory device including a memory controller, an encoder computing an inversion-invariant linear error correction code and an associated decoder, the memory device being connected to an external processor, the checking device comprising means for implementing the steps of the method according to claim 1.

5. The method according to claim 1 further comprising an electroforming process for a resistive memory of a memory device including a memory controller, an encoder computing an inversion-invariant linear error correction code, and a write device connected directly to the encoder, the process comprising the following steps:

requesting a write operation to the memory device at an initial address corresponding to a selection of multiple resistors, with data to be written comprising k data bits all having one and the same first logic value, called electroforming value, from among two possible logic values "0" and "1";

encoding the k data bits with the inversion-invariant linear error correction code so as to obtain a codeword comprising the data bits and r check bits, such that the check bits are dependent on an odd number of the data bits, resulting in the data bits and the check bits all having the same first logic value; and writing, by way of the write device connected directly to the encoder and directly receiving, as write value instruction, the values from the encoder, the codeword to the selected resistors of said resistive memory, the memory controller carrying out a write operation in 1T1R mode corresponding to an individual write operation for each resistor, each resistor being put into a high-impedance or low-impedance state according to the respective logic value of each bit of the codeword, the memory controller applying write conditions allowing the electroforming.

6. The method according to claim 5, the process comprising the following subsequent steps:

requesting a read operation by the memory controller at the initial address in the resistive memory to which said codeword has been written and comparing the read value with an expected value and, if said values do not match, saving an electroforming address in a status register of the memory controller and/or in a register of an external processor connected to the memory device, incrementing or decrementing the initial address, so as to obtain a new address corresponding to the selection of resistors other than those of the initial address; and checking whether this new address is out of range:

if so, ending the process;

if not, reiterating the steps of claim 1 at the new address.

7. The method according to claim 5, the electroforming process comprising the following subsequent steps:

supplying the read codeword to a decoder able to supply k data bits that are corrected if necessary based on the check bits, the decoder being able to inform a status register of the memory controller indicating the presence or absence of a correctable or non-correctable error in the codeword that has just been read;

and wherein the step of comparing the read value and an expected value includes an operation of consulting said status register of the controller.

8. The method according to claim 5, the electroforming process comprising the following subsequent steps:

requesting, via an external processor, a read operation at the initial address and/or at a new address and checking whether all of the data bits returned to said processor, obtained at output from a decoder that received the read codeword, all have one and the same logic value from among two possible logic values "0" or "1";

if all of the data bits all have the same expected logic value "0" or "1", reading the status register of the memory controller in order to check the presence or absence of an error that has been corrected by said decoder in the codeword that has just been read; and, depending on the result of the check:

signaling an electroforming error; or ending the process;

if all of the data bits do not all have the same logic value "0" or "1", signaling an electroforming error.

9. The method according to claim 5, the steps of the process being iterated at least once with data to be written wherein the logic value of the bits is different from the logic value of the bits of a previous iteration.

10. A electroforming device for a resistive memory of a memory device including a memory controller, an encoder computing an inversion-invariant linear error correction code, and a write device connected directly to the encoder, the electroforming device comprising means for implementing the steps of the method according to claim 5.

11. The electroforming device according to claim 10, wherein the means comprise a host processor, the steps of the electroforming process according to claim 5 being implemented by interactions between the host processor and the memory controller.

12. The method according to claim 5, wherein the inversion-invariant linear error correction code is of a type SEC, SEC-DED, DEC, DEC-TED, TEC, and/or TEC-QED.

* * * * *